(12) United States Patent
Chatradhi et al.

(10) Patent No.: US 9,286,159 B2
(45) Date of Patent: Mar. 15, 2016

(54) TRACK-BAND SQUEEZED-SECTOR ERROR CORRECTION IN MAGNETIC DATA STORAGE DEVICES

(71) Applicant: HGST Netherlands B.V., Amsterdam (NL)

(72) Inventors: Sridhar Chatradhi, San Jose, CA (US); Martin Aureliano Hassner, Mountain View, CA (US); Kirk Hwang, Palo Alto, CA (US); Satoshi Yamamoto, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 205 days.

(21) Appl. No.: 14/072,923

(22) Filed: Nov. 6, 2013

(65) Prior Publication Data

US 2015/0128008 A1  May 7, 2015

(51) Int. Cl.
*G11B 20/18* (2006.01)
*G06F 11/00* (2006.01)
*G06F 11/10* (2006.01)
*G11B 20/12* (2006.01)

(52) U.S. Cl.
CPC ........ *G06F 11/1076* (2013.01); *G11B 20/1833* (2013.01); *G11B 2020/1222* (2013.01)

(58) Field of Classification Search
CPC ................. G11B 2020/1222; G06F 11/1076
See application file for complete search history.

(56) References Cited

U.S. PATENT DOCUMENTS

| | | | |
|---|---|---|---|
| 4,908,826 A * | 3/1990 | Hertrich | 714/755 |
| 4,949,326 A * | 8/1990 | Takagi et al. | 369/53.17 |
| 5,241,531 A * | 8/1993 | Ohno et al. | 369/275.2 |
| 5,247,523 A * | 9/1993 | Arai et al. | 714/755 |
| 5,251,219 A * | 10/1993 | Babb | 714/755 |
| 5,392,299 A * | 2/1995 | Rhines et al. | 714/756 |
| 5,745,453 A * | 4/1998 | Ikeda | 372/46.012 |
| 5,761,169 A * | 6/1998 | Mine et al. | 369/84 |
| 5,974,580 A * | 10/1999 | Zook et al. | 714/755 |
| 5,991,911 A * | 11/1999 | Zook | 714/758 |
| 6,275,965 B1 | 8/2001 | Cox et al. | |
| 6,311,304 B1 * | 10/2001 | Kwon | 714/755 |
| 6,891,690 B2 | 5/2005 | Asano et al. | |
| 7,362,529 B2 | 4/2008 | Chiao et al. | |
| 7,490,212 B2 | 2/2009 | Kasiraj et al. | |
| 7,570,445 B2 | 8/2009 | Alfred et al. | |
| 7,589,925 B1 | 9/2009 | Chiao et al. | |
| 7,639,447 B1 | 12/2009 | Yu et al. | |
| 7,663,835 B1 | 2/2010 | Yu et al. | |
| 7,706,096 B2 | 4/2010 | Ito et al. | |
| 7,890,796 B2 * | 2/2011 | Pawar et al. | 714/4.12 |
| 7,929,632 B2 * | 4/2011 | Shao | 375/267 |
| 8,225,185 B1 * | 7/2012 | Tang et al. | 714/784 |
| 8,375,274 B1 * | 2/2013 | Bonke | 714/770 |
| 2001/0012252 A1 * | 8/2001 | Yoshimoto et al. | 369/53.22 |
| 2002/0003947 A1 * | 1/2002 | Abe et al. | 386/96 |
| 2002/0024891 A1 * | 2/2002 | Yamazaki et al. | 369/30.12 |
| 2002/0054681 A1 * | 5/2002 | Kuribayashi et al. | 380/210 |
| 2005/0025022 A1 * | 2/2005 | Nakagawa | 369/59.23 |

(Continued)

*Primary Examiner* — Joseph D Torres
(74) *Attorney, Agent, or Firm* — G. Marlin Knight

(57) ABSTRACT

Data storage devices using a two-level ECC scheme are described. Embodiments of the invention allow the recovery of sectors in a squeezed group of tracks in a that includes both a single track level ECC scheme and a track band ECC scheme that functions across the set of tracks in the band. The track band ECC scheme uses additional parity information calculated using input data from multiple tracks to allow correction across tracks.

18 Claims, 5 Drawing Sheets

Track Band ECC System – Write flow

(56) References Cited

U.S. PATENT DOCUMENTS

| | | | |
|---|---|---|---|
| 2005/0044469 A1* | 2/2005 | Nakagawa et al. | 714/769 |
| 2005/0071537 A1 | 3/2005 | New et al. | |
| 2005/0204267 A1* | 9/2005 | Nakagawa et al. | 714/770 |
| 2005/0229075 A1* | 10/2005 | Berkmann et al. | 714/758 |
| 2007/0121449 A1* | 5/2007 | Taniguchi et al. | 369/47.53 |
| 2007/0198890 A1* | 8/2007 | Dholakia et al. | 714/758 |
| 2008/0155316 A1* | 6/2008 | Pawar et al. | 714/8 |
| 2008/0225659 A1* | 9/2008 | Kuroda et al. | 369/53.11 |
| 2009/0290463 A1* | 11/2009 | Kuze et al. | 369/53.17 |
| 2010/0095181 A1 | 4/2010 | Ma et al. | |
| 2010/0097903 A1* | 4/2010 | Kimura et al. | 369/47.14 |
| 2010/0218037 A1* | 8/2010 | Swartz et al. | 714/6 |
| 2011/0075292 A1 | 3/2011 | New et al. | |
| 2011/0096828 A1 | 4/2011 | Chen et al. | |
| 2012/0303930 A1* | 11/2012 | Coker et al. | 711/207 |
| 2013/0148225 A1* | 6/2013 | Coker et al. | 360/31 |

* cited by examiner

Track Band Layout

US 9,286,159 B2

TRACK-BAND SQUEEZED-SECTOR ERROR CORRECTION IN MAGNETIC DATA STORAGE DEVICES

RELATED APPLICATIONS

The subject matter of the present invention is related to the subject matter of co-pending application "SCALABLE REPAIR BLOCK ERROR CORRECTION FOR SEQUENTIAL MULTIPLE DATA BLOCKS IN A MAGNETIC DATA STORAGE DEVICE" bearing Ser. No. 13/645,309 with a filing date of 4 Oct. 2012, which is hereby incorporated by reference.

FIELD OF THE INVENTION

Embodiments of the invention relate to error correction techniques in magnetic data storage devices.

BACKGROUND

Conventional disk drives with magnetic media organize data in concentric tracks that are spaced apart. The concept of shingled writing is a form of magnetic recording and has been proposed as a way of increasing the areal density of magnetic recording. In shingle-written magnetic recording (SMR) media a region (band) of adjacent tracks are written so as to overlap one or more previously written tracks. The shingled tracks must be written in sequence unlike conventionally separated tracks, which can be written in any order. Tracks on an SMR disk surface are organized into a plurality of shingled regions. Once written in the shingled structure, an individual track or sector cannot be updated in place, because that would overwrite and destroy the overlapping tracks.

ECC in disk drives is used to correct errors and erasures, which occur when a data element is missing or known to be faulty. Traditionally ECC is performed on a sector basis using redundant bits appended to the sector data when it is written. These sector ECC approaches are not ideal for some disk drive applications such as streaming audio-video (AV) and the SMR architecture presents additional ECC problems. A problem addressed by the invention described herein is the recovery of sectors in "squeezed" tracks in a Shingled Magnetic Recording (SMR)-System.

US patent application 20110075292 by Richard New, et al. (Mar. 31, 2011) describes SMR drives in which band establishes a respective segment in a log-structured file system. Large error correction (ECC) block sizes within each segment (band) are implemented by storing the intermediate ECC parity state after each partial write of an ECC block. In this case, the ECC block size spans multiple physical sectors, and because of the larger ECC block size the error correction code is more efficient and able to correct larger defect errors on the disk. The ECC code may be implemented in a number of different ways which are known to those skilled in the art of designing ECC codes.

U.S. Pat. No. 7,490,212 to Kasiraj, et al. (Feb. 10, 2009) describes ECC for an SMR drive that is useful for recording and playback of video data in transaction data blocks larger than the conventional 512 byte block size but smaller than the band size. Large physical sectors can be used to improve format efficiency, and large ECC codeword sizes (larger than the transaction block size) can be used to improve reliability without imposing a read-modify-write performance on the system. To do this, the disk drive saves the cumulative ECC parity state between successive partial writes of each transaction block so that the parity computed in a first write operation is used to generate the parity for a subsequent write operation. For example, a transaction block size might be one megabyte, and the ECC might span the entire band. Each time a transaction block is written, gradually filling up the band, the cumulative parity state for the ECC is maintained, so that at the end of the last transaction block in that band, the ECC parity can be written out. This provides a very long ECC block size and therefore a very efficient ECC code which is resilient to defects and errors. The ECC code could be very simple, such as a single parity sector computed by XORing all of the data in the physical sectors in the band. This provides protection against a single sector failure within the band. However, using XORing the error correction block is a parity sector that can only correct one data block and is not scalable.

Published patent application 20110096828 (Apr. 28, 2011) by Ying Chen, et al. describes a system with encoding and decoding blocks with multiple independent scalability layers. The Forward Error Correction (FEC) is assumed to be applied to a "block" or "fragment" of data at a time, i.e., a "block" is a "source block" for FEC encoding and decoding purposes. A client device can use the segment indexing described herein to help to determine the source block structure of a segment. The FEC codes considered for use with block-request streaming are typically systematic FEC codes, i.e., the source symbols of the source block may be included as part of the encoding of the source block and thus the source symbols are transmitted. A systematic FEC encoder generates, from a source block of source symbols, some number of repair symbols and the combination of at least some of the source and repair symbols are the encoded symbols that are sent over the channel representing the source block. Some FEC codes may be useful for efficiently generating as many repair symbols as needed, such as "information additive codes" or "fountain codes" and examples of these codes include "chain reaction codes" and "multi-stage chain reaction codes". Other FEC codes such, as Reed-Solomon codes may practically only generate a limited number of repair symbols for each source block.

Hard disk drive (HDD) archival applications such as so called "cold-storage" refer to data that is stored for various reasons but is rarely ever read again. For these applications the HDD design tradeoffs between density of storage, access speed, etc. are different than for HDDs used for data that is frequently read. Shingled Magnetic Recording (SMR) designs are particularly suitable and cost effective for cold storage. HDD archival applications such as "Cold-Storage" require increased capacities, obtained by TPI-Increase, as well as Data Integrity that guarantees data retrieval. These are conflicting requirements, as TPI increases by squeezing the width of the tracks, invariably results in unreadable "squeezed sectors".

SUMMARY OF THE INVENTION

Embodiments of the invention described herein allow the recovery of sectors in a squeezed group of tracks using a two-level ECC scheme that includes both a single track level ECC scheme and a track band ECC scheme that functions across the set of tracks in the band. The track band ECC scheme uses additional parity information calculated using input data from multiple tracks to allow correction across tracks.

In embodiments of the invention tracks are organized into groups or bands of tracks (which will be called ECC track bands) that allow squeezed-sector corrections across tracks. In addition to the first level ECC capability for error corrections in a single track, embodiments of the invention use an ECC track band with reserved space for redundant parity sectors to dynamically correct for errors in a written track that exceed the first level ECC for the track. In some embodiments the additional parity information is written within the ECC track band, e.g. in the last track of the band. In alternative embodiments the track band parity sectors can be written in an exception track, which is not adjacent to the other tracks in the band, that is dedicated to track band parity sectors. In Shingled Magnetic Recording (SMR) disk drives, sequential logical blocks of user data are generally written in sequential physical tracks in shingled regions, so an ECC parity block that covers multiple sequential tracks according to the invention is practical without incurring a large performance penalty.

Embodiments of the invention are particularly useful in cold-storage applications by a) helping to achieve specified hard-error rate data recoverability in cold-storage devices, and b) increasing the sector erasure correction capability in the presence of "aging" and adjacent track interference (ATI) and far track interference (FTI) which can cause track squeeze propagation. In an exemplary embodiment of the invention data capacity can be increased by 25% increasing track squeeze with the extra ECC protection blocks taking up only an additional 1% of capacity, for a net 24% data increase.

Although the second level track band ECC according to the invention can be implemented using different mathematical algorithms than are used for first level single track ECC, embodiments will be described in which complementary algorithms are used for each level. An algebraic solution disclosed for particular embodiments of the invention integrates the sector-data in an ECC track band by using a Vandermonde Matrix discrete Fourier transform (DFT) in tandem with a Cauchy-Matrix Parity Sector Encoder to generate Track Band Parity Sectors for a track band. Both matrices are structured matrices, such that encoder/syndrome-generator and decoder are implemented using iteratively calculated programmable-multipliers and SRAM-storage accumulators.

DETAILED DESCRIPTION OF THE INVENTION

Figure 1:
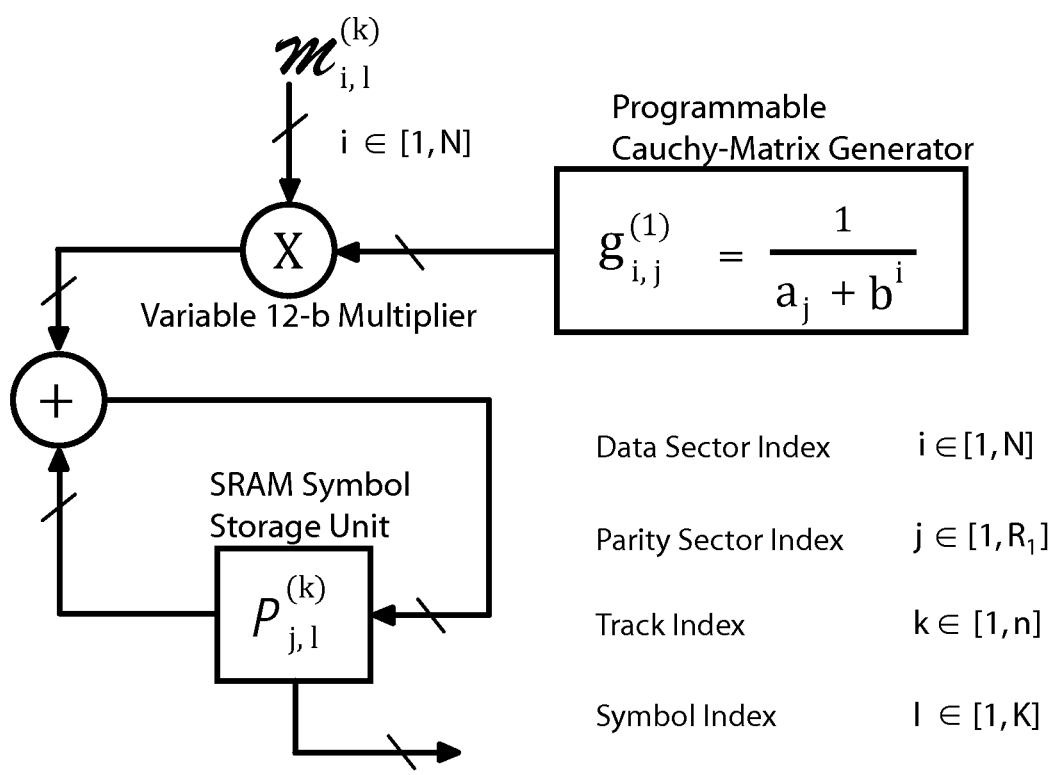
FIG. 1 is a block diagram illustrating a track encoder according to an embodiment of the invention.

Statistical test data on squeeze-errors suggests that within a selected band of adjacent tracks the number of "bursty tracks" in which the number of squeezed sectors exceeds an average number, is relatively small. This empirical evidence suggests that a Squeezed Sector Erasure Correction Scheme, that calculates Track Band Parity Sectors within a selected Band of Tracks to correct a large number of "Squeezed Sectors" read error in a limited number of "Bursty-Tracks" can solve the problem of both guaranteeing required data retrieval reliability, as well as increasing capacity by allowing narrower tracks that result in some squeezed data errors. The empirical data suggests that embodiments of such a scheme according to the invention will permit 20% TPI capacity gain at the expense of less than 2% additional parity sector overhead, which includes both track-parity sectors as well as track-band parity sectors.

Embodiments of the invention add Track Band Parity Sectors that can be applied to any "Bursty Track" in which the number of unreadable Squeezed Sectors exceeds the level-1 single Track-ECC correction capability. This approach is better than providing all individual tracks with a maximum number of Parity Sectors, capable of restoring all the Bursty-Track data, which would cause the loss of the TPI-Squeeze capacity gain in increased overhead.

The algebraic solution disclosed herein for embodiments of the invention integrates the sector data in a track band by using a Vandermonde Matrix DFT (discrete Fourier transform) in tandem with a Cauchy-Matrix Parity Sector Encoder to generate "Track Band Parity Sectors". Both matrices are structured matrices, such that the encoder/syndrome-generator and decoder are implemented using iteratively calculated Programmable-Multipliers and SRAM-Storage Accumulators, that are used in SMR hard disk controller (HDC) implementation. Note that standard Reed-Solomon (RS) code shift-register implementation is unacceptable for this application.

The implementation of one embodiment of the invention uses programmable Cauchy Matrix generators and SRAM parity sector data storage implemented in hardware in the hard disk controller (HDC). In the first level track ECC, $R_1$ parity sectors per track are implemented to provide for restoration of $R_1$ squeezed sectors in each track in an n track band with N sectors per track. In the second level ECC, $B \times R_2$ parity sectors, which are flexibly available to be used in any bursty track within the track band, provide for restoration $(R_1+R_2)$ squeezed sectors in B bursty tracks within the n track band. As an example, with n=64, N=348, B=7, $R_1$=6, $R_2$=6, with a standard 20% squeeze test data suggests that 2% overhead for the two level scheme provides guaranteed data integrity for a standard Cold Storage application.

The implementation of an embodiment of the invention will now be described. The track-level $R_1$ parity N sector programmable multiplier operates as follows:

$$P_{j,l}^{(k)} = \sum_{i=1}^{N} g_{i,j}^{1} m_{i,l}^{k}, G=[g_{i,j}^{1}]$$

Fix k track index and l symbol index, then sum over i sector index to generate l-th symbol of j-th parity sector for k-th track.

Iteratively calculate (cumulatively store in SRAM):

$$P_j^{(k)} = [P_{j,l}^{k}] l=1,\ldots,K, \text{k-th track/j-th parity sector.}$$

Index Ranges are defined as:
Track Index $k \in [1, n]$
Parity Sector Index $j \in [1, \ldots, R_1]$
Sector Index $i \in [1, \ldots, N]$
Symbol Index $l \in [1, K]$ The operation of the 4K sector Cauchy-Matrix encoder embodiment over Galois field $GF(2^{12})$ is described as follows:

$$GF^*(2^{12}) = \{z^k\}, k \in [1, 2^{12}-1], z|z^{12}+z^6+z^4+z+(1::GF(2))$$

$$\text{First-Level } G_1 = \frac{1}{a_j + b^i}, \text{rank}-(G_1) = R_1$$

$$a_j = z^j, j \in [1, R_1] - \text{Row Index,}$$

-continued $b = z^{499}, i \in [1, N]$ – Column Index

Second-Level $G_2 = \dfrac{1}{a_j + b^i}$, rank $- (G_2) = R_2 - R_1$ $a_j = z^i, j \in [R_1 + 1, R_2]$ – Row Index, $b = z^{499}, j \in [1, N]$ – Column Index FIG. 1 is a block diagram illustrating a first level track encoder according to an embodiment of the invention as described above.

An n-track band parity sector generator embodiment is described as follows:

Track-Band Level $R_2$ Parity Encoder for B tracks with more than $R_1$ and up to $R_1+R_2$ erased sectors:

B×n-Vandermonde Matrix $V=[Z^{k^b}]$, k∈[0, ..., n−1], b∈[0, ..., B−1] entries are used as cross-track DFT multipliers to create invertible B distinct n track combinations, each encoded into $R_2$ parity sectors.

Any B×B submatrix of the B×n-Vandermonde Matrix, defined by B bursty track column pointers, is iteratively invertible. (This is implemented as Media Error Detection Code (MEDC) Erasure Decoder, see related application bearing Ser. No. 13/645,309); Thus, in any 8 bursty tracks within the n track band, up to $R_1+R_2$ squeezed (erased) sectors can be recovered and restored.

The B×$R_2$-Track Band Parity Sector Generator is further described as follows:

$R_2$-Track Band Parity Sectors are calculated for B-DFT sums of the n-Track Band $\hat{P}_{j,l}^{(b)} = \Sigma_{k=0}^{n-1} z^{kb} \Sigma_{i=1}^{N} g_{i,j}^{(2)} m_{i,l}^{(k)}, G_2 = [g_{i,j}^{(2)}]$ Programmable-Multiplier Cauchy Matrix Fix Bursty-Track Index-b ∈[0, ..., 8−1] and then Sum over Track Index k∈[0, ..., n−1] and Sector Index i∈[1, ..., N] to produce B×$R_2$ Track Band Parity Sectors.

$\hat{P}_j^{(b)} = [\hat{P}_{j,l}^{(b)}] l = 1, ..., K]$

Parity Sector Index j∈[$R_1$+1, ..., $R_2$]

Figure 2:
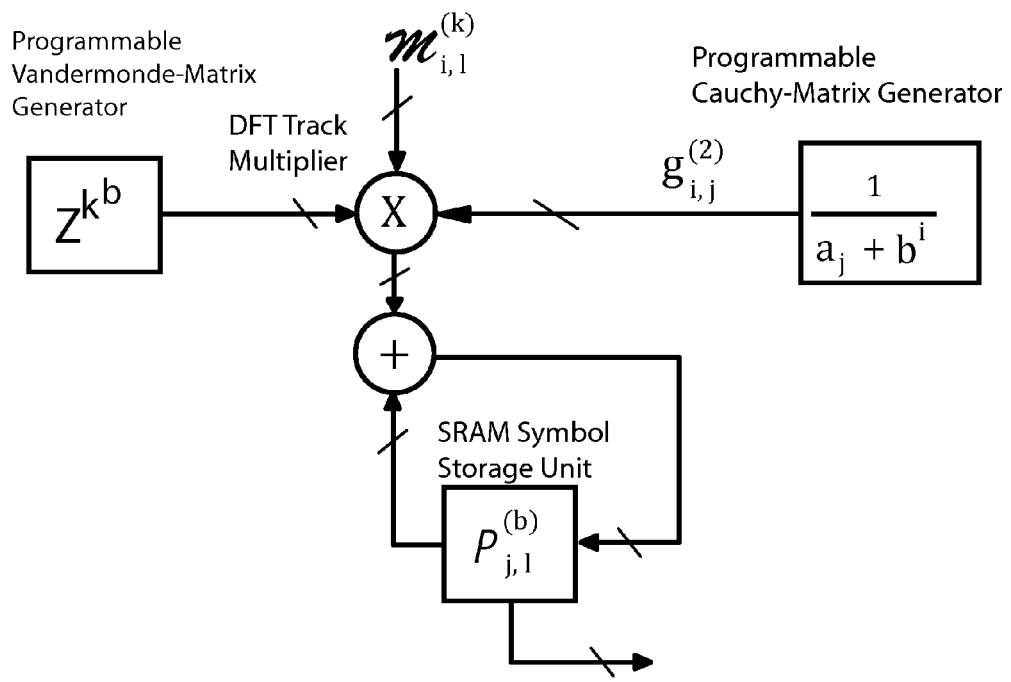
FIG. 2 is a block diagram illustrating a track band encoder according to an embodiment of the invention.

FIG. 2 is a block diagram illustrating a second level track band encoder according to an embodiment of the invention as described above.

The format for writing an n-track band according to an embodiment of the invention is described as follows:

N-sector $T_k = [M_1^{(k)}, ..., M_N^{(k)}]$, Index-kTrack, where $T_k$ is the N-Sector k-th track data.

Written track includes the user data plus appended parity sectors for the first level ECC:

$[T_k, P_1^{(k)}, ..., P_{R_1}^{(k)}], k=1, ..., n$ where there are $R_1$ parity sectors $P_j^{(k)}$, j∈[1, ..., $R_1$].

The track band includes additional parity sectors (B×$R_2$-Track Band Parity Sectors) for the second level ECC that are written, for example, in either the last track of the band or in an exception track that is dedicated to Track Band Parity Sectors:

$[\hat{P}_j^{(b)}], b \in [0, ... B-1], j \in [R_1+1, ..., R_2]$,

The squeezed-sector modified parity sector encoder for tracks and track bands is further described as follows. The modified parity sector encoder is used in the decoding process. When the sectors on tracks are read back, some of those sectors can be unreadable because track squeeze has in effect erased the magnetic information needed to directly read the data. The MEDC erasure pointers detect squeezed sectors in each track as previously described. The process of recovering the data using the redundant parity includes re-encoding the sectors of data that can be read and skipping sectors that have been erased. The result of this re-encoding process will be called "Modified Parity Sectors" that contain only the contribution of the readable (non-squeezed) sectors.

Once this calculation is completed, the "Modified Parity Sectors" are XOR'ed with the original "Written Parity Sectors" to obtain SYNDROMES. These now contain the contribution of only those sectors that were unreadable, and are processed by the Decoder to regenerate the erased data.

$\tilde{P}_{j,l}^{(k)} = \Sigma'_i g_{i,j}^{(1)} \tilde{m}_{i,l}^{(k)}, \tilde{P}_j^{(k)} = [\tilde{P}_{j,l}^{(k)}]_{l=1}^{K}$ where sum $\Sigma'_i$ skips unreadable squeezed sectors to produce track-level modified parity sectors: $\{\tilde{P}_j^k\}_{j=1}^{R_1}$ $\hat{\tilde{P}}_{j,l}^{(b)} = \sum_k z^{kb} \sum_i' g_{i,j}^{(2)} \tilde{m}_{i,l}^{(k)}$ where $\Sigma_k$ sums over all tracks and $\Sigma'_i$ skips squeezed sectors in each track to cumulatively generate B×$R_2$-Modified Track Band Parity Sectors:

$\hat{\tilde{P}}_j^{(b)} = [\hat{\tilde{P}}_{j,l}^{(b)}]_{l=1,...K}$, b ∈ [0, ... B − 1], j ∈ [R1 + 1, ... R2].

Track-Parity syndrome sectors are generated by XOR-ing the modified read-parity sectors with the written-parity sectors:

$S_j^{(k)} = \tilde{P}_j^{(k)} \oplus P_j^{(k)}, j \in [1, ..., R_1]$

The track-parity syndrome sectors are the squeezed sectors encoded by the Cauchy submatrix, defined by the squeezed sector pointers in each track, which are recoverable by iterative Cauchy submatrix Inversion.

A track-level syndrome-sector decoder is described in the related application bearing Ser. No. 13/645,309. Restoration of index-k tracks with $E_1^{(k)} \leq R_1$ squeezed sectors indexed by MEDC-erasure pointers $T_{E,k} = [i_1^{(k)}, ..., i_{E_1}^{(k)}]$ Syndrome-sector multiplication by an $E_{1,k} \times E_{1,k}$ Cauchy submatrix, iteratively calculated, inverse restores the $E_{1,k}$ squeezed sectors:

$[S_j^{(k)}] \to [g_{i_m,j}^{(k)(1)}]^{-1} [S_1^{(k)}, ... S_{E_{1,k}}^{(k)}]^T \to [M_{i_m}^{(k)}], i_m^{(k)} \in [i_1^{(k)}, ..., i_{E_1}^{(k)}], j \in [1, ..., E_1^{(k)}]$

The result is $\{M_{i_m}^{(k)}\}$ restored sectors in k-th track. The track level error correction system, therefore, supplies the readable and first level corrected sectors to the track band error correction system for the second-level error correction.

The track-band parity syndrome sector generation process is further as follows. The track-band modified parity sectors are updated:

$$\Delta \hat{P}_{j,l}^{(b)} = \sum_k{}' z^{k^b} \sum_{i_r}{}'' g_{i_r,j}^{(2)} m_{i_r,l}^{(k)}$$

where Sum $\Sigma'_k$ skips bursty tracks and
Sum} $\Sigma''_{i_r}$ is over the Restored Sectors in each non-bursty track.

Track-band modified parity sectors after track-level correction update process:

$$\hat{P}_j^{(b)} = \left[ \hat{P}_{j,l}^{(b)} + \Delta \hat{P}_{j,l}^{(b)} \right]_{l=1,\ldots,K} \text{ where}$$

$b \in [0, \ldots B-1]$, $j \in [R_1+1, \ldots R_2]$.

The track-band parity syndrome sectors are a Vandermonde submatrix combination of the "bursty" tracks and the Cauchy submatrices defined by the squeezed sector pointers in each b-Index "bursty" track:

$$\hat{S}_j^{(b)} = \hat{P}_j^{(b)} \oplus \hat{P}_j^{(b)}, j \in [R_1+1, \ldots, R_2].$$

Figure 3:
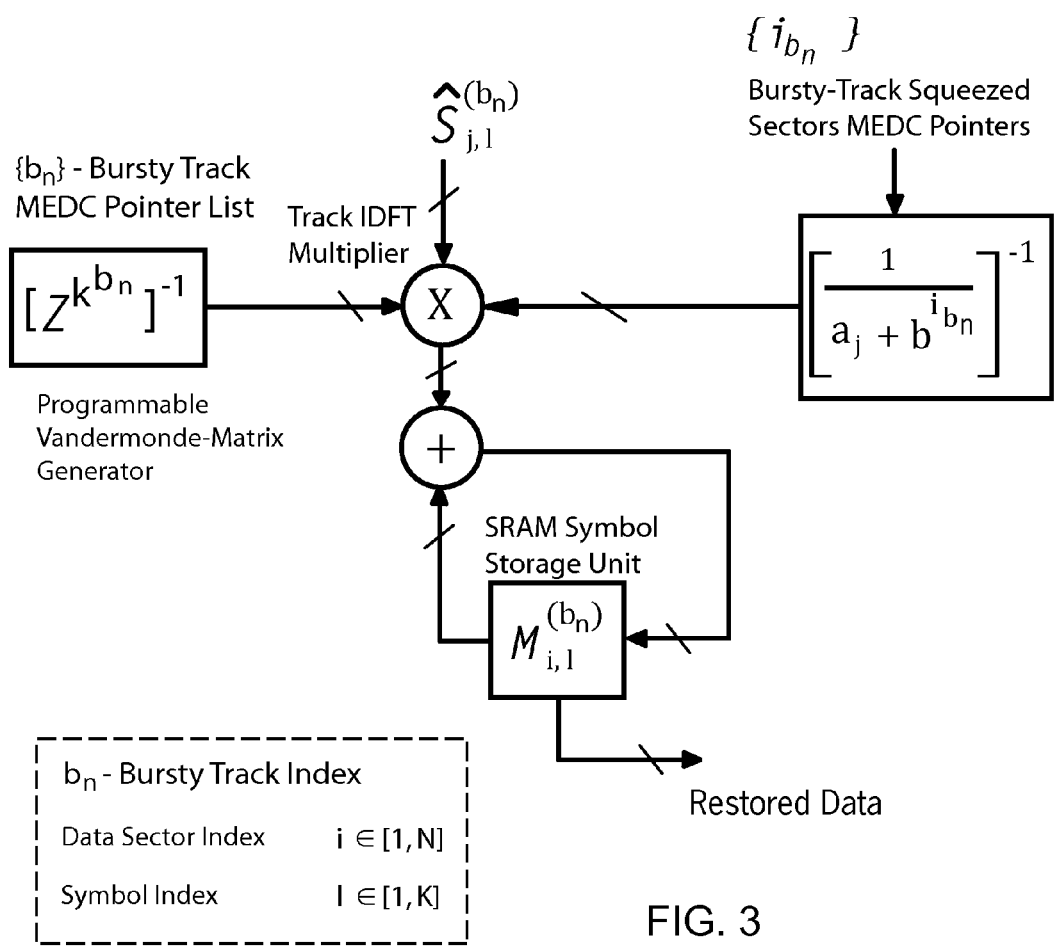
FIG. 3 is a block diagram illustrating a track band decoder according to an embodiment of the invention.

The track-band level syndrome-sector decoding process is further described below and illustrated in FIG. 3. The iterative inverse of the Vandermonde submatrix is calculated as previously described:

$$V_{T_B} = [z^{k^b n}], V_{T_B} \subset V$$

indexed by Pointers to $E_B$ bursty tracks with $E_2^{(b_n)}$ squeezed sectors,
so that $R_1 \leq E_2^{(b_n)} \leq R_1 + R_2$
and $T_B = [b_1, b_2, \ldots, b_{E_B}]$, $E_B \leq B$.
Bursty-track decoupling is performed as:

$$[\hat{S}_j^{(b_n)}] \to V_{T_B}^{-1} [\hat{S}_j^{(b_n)}] \to [S_j^{(b_n)}], j \in [R_1+1, \ldots, R_2]$$

Restore $E_2^{(b_n)}$-Squeezed Sectors in $E_B$ bursty tracks $$[S_j^{(b_n)}] \to \begin{bmatrix} g^{(1)}(i_n^{(b_n)}, j) \\ g^{(2)}(i_n^{(b_n)}, j) \end{bmatrix}^{-1} [S_j^{(b_n)}] = [M_{i_n}^{(b_n)}]$$

$$i_n^{(b_n)} \in \left[ i_1^{(b_n)}, \ldots, i_{E_2^{(b_n)}}^{(b_n)} \right], j \in \left[ 1, \ldots, E_2^{(b_n)} \right]$$

Figure 4:
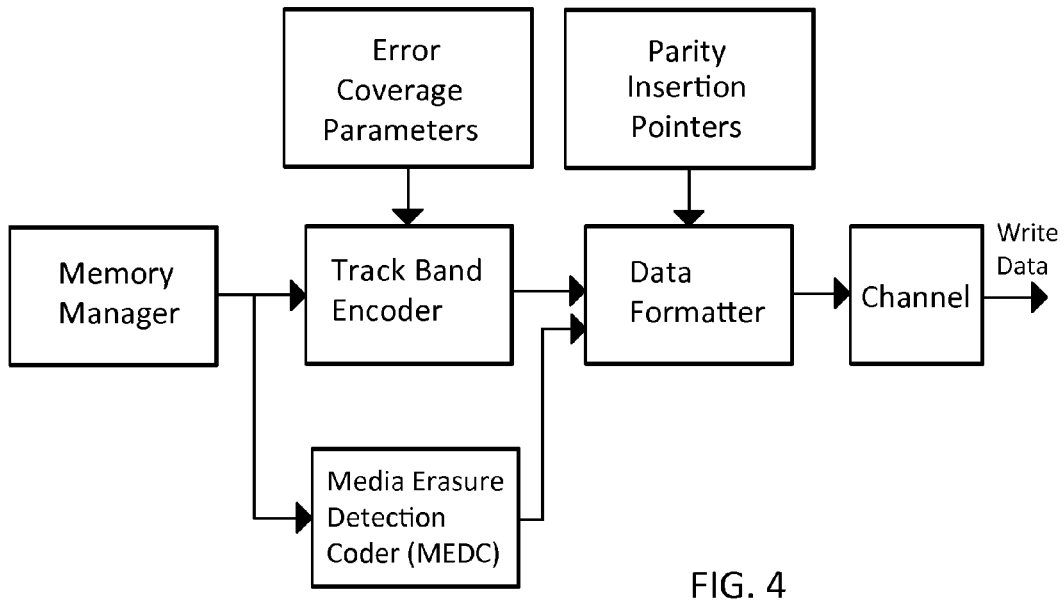
FIG. 4 is a block diagram illustrating the flow of the write track band ECC system according to an embodiment of the invention.

FIG. 4 is a block diagram illustrating the flow of the write process in a track band ECC system according to an embodiment of the invention. The Memory Manager generally functions in the standard way for an SMR disk drive and will have all of the data for a track band stored in memory. The Track Band Encoder, which is programmable in this embodiment, receives as input the "Error-Coverage Parameters" that determine the number of Track Band Parity Sectors required in the particular embodiment. The encoder output is then inserted by the Data Formatter into the data that is fed to the Read/Write Channel, which outputs the data that will be written on the disk. The Data Formatter is also programmable and accepts the Parity Insertion Pointers as an input parameter. The Media Erasure Detection Coder (MEDC) unit MEDC provides the parity data to Data Formatter, which is used to produce Erasure Pointers as needed during the read process. The track band parity sectors are written using the same basic recording techniques as are used for user data sectors in the disk drive; therefore, the Read/Write Channel, arm electronics (not shown), and read/write heads (not shown) handle the parity data bits and sectors like any other data bits and sectors.

Figure 5:
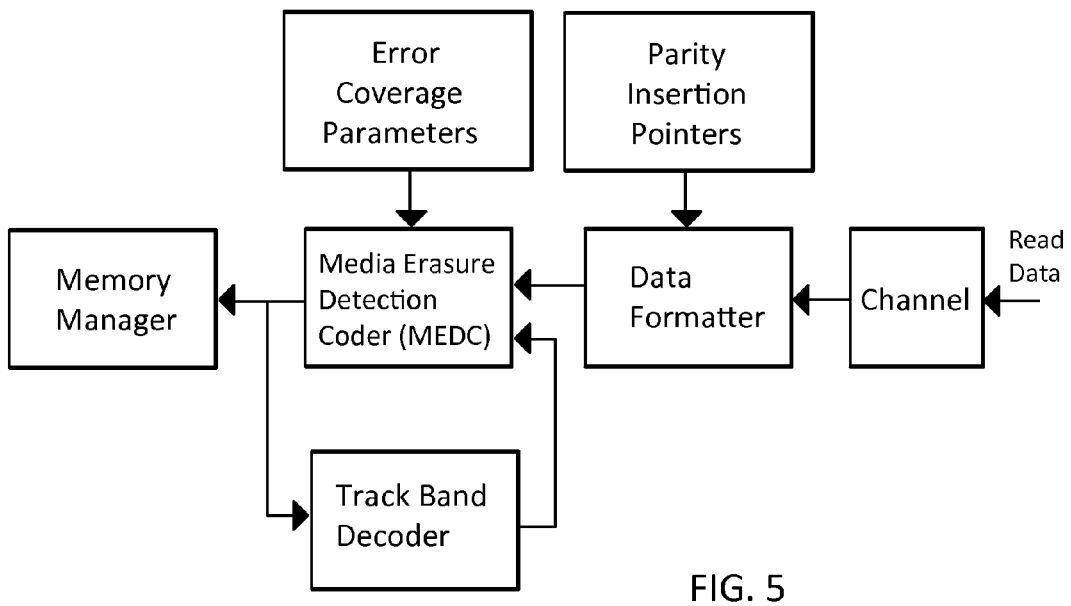
FIG. 5 is a block diagram illustrating the flow of the read track band ECC system according to an embodiment of the invention.
Figure 6:
FIG. 6 is a block diagram illustrating the track band layout according to an embodiment of the invention.
Figure 6:
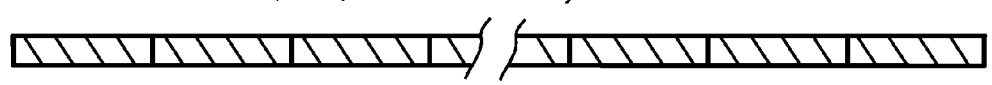

FIG. 5 is a block diagram illustrating the flow of the read process in a track band ECC system according to an embodiment of the invention. The data read from the disk flows into the Read/Write Channel. The Media Erasure Detection Coder (MEDC) unit MEDC produces Erasure Pointer input to the Track Band Decoder. The Erasure Pointers indicate the sectors that need to be skipped in the syndrome calculation as describe above. The recovered sector output from the Track Band Decoder is provided to the Memory Manager. The recovered sectors are then sent upstream to the requesting component or system such as a host computer.

The invention claimed is:

1. A data storage device that stores data in tracks that include a plurality of sectors of data, the data storage device comprising:
   a first-level error correction system that writes track parity information on each track in a selected band of tracks, the track parity information being calculated using a first mathematical algorithm using data stored on one track and performs error correction using the track parity information on a selected track when the selected track is read; and wherein the first-level error correction system detects unreadable sectors in the selected track and wherein the first-level error correction includes generating modified track parity data using readable sectors and skipping unreadable sectors; and
   a second-level error correction system that writes track band parity information for the selected band of tracks, the track band parity information being calculated using a second mathematical algorithm using data stored on the selected band of tracks and performs error correction using the track band parity information on a selected track band when the selected track band is read; and wherein the second-level error correction system performs error correction after the first-level error correction has completed and the second-level error correction includes generating modified track band parity data using readable and corrected sectors supplied by the first-level error correction system.

2. The data storage device of claim 1 wherein the data storage device uses shingled magnetic recording and the selected band of tracks are included in shingled region.

3. The data storage device of claim 1 wherein the second-level error correction system can correct up to a programmable number of sector-erasures in the selected track within the selected band of tracks that exceed the first-level error correction system's capability.

4. The data storage device of claim 1 wherein the track band parity information is stored on a track dedicated to track band parity information.

5. The data storage device of claim 1 wherein the second-level error correction system corrects for squeezed sector errors in the selected track.

6. The data storage device of claim 1 wherein the second-level error correction system generates the track band parity information in sectors by using a Vandermonde matrix discrete Fourier transform (DFT).

7. The data storage device of claim 1 wherein the second-level error correction system generates the track band parity information in sectors by using a Vandermonde matrix discrete Fourier transform (DFT) in tandem with a Cauchy-Matrix parity sector encoder.

8. The data storage device of claim 1 wherein the second-level error correction system generates the track band parity information using iterative calculation with programmable-multipliers and storage accumulator memory.

9. The data storage device of claim 1 wherein the second-level error correction system includes an encoder/syndrome-generator and decoder using iteratively calculated programmable-multipliers and storage accumulators.

10. The data storage device of claim 1 wherein the second-level error correction system generates the track band parity information in sectors by using a Vandermonde matrix discrete Fourier transform (DFT) in tandem with a Cauchy-Matrix parity sector encoder and wherein the matrices are structured and an encoder/syndrome-generator and decoder use programmable-multipliers and SRAM-storage accumulators for iterative calculations.

11. The data storage device of claim 1 wherein error correction further includes calculating syndromes containing information for the unreadable sectors by XOR'ing the modified track parity data with the track parity information read from the selected track.

12. A method of operating a data storage device that stores data in tracks that include a plurality of sectors of data, the method comprising:
performing a first-level error correction by writing track parity information on each track in a selected band of tracks, the track parity information being calculated using a first mathematical algorithm using data stored on one track and performing error correction using the track parity information on a selected track when the selected track is read; and wherein the first-level error correction includes detecting unreadable sectors in the selected track and generating modified track parity data using readable sectors and skipping unreadable sectors; and
performing a second-level error correction by writing track band parity information for the selected band of tracks, the track band parity information being calculated using a second mathematical algorithm using data stored on the selected band of tracks and performing error correction using the track band parity information on a selected track band when the selected track band is read; and wherein the second-level error correction performs error correction after the first-level error correction has completed and the second-level error correction includes generating modified track band parity data using readable and corrected sectors supplied by the first-level error correction system.

13. The method of claim 12 wherein the second-level error correction corrects for errors in the selected track that exceed the first-level error correction capability.

14. The method of claim 12 wherein error correction further includes calculating syndromes containing information for the unreadable sectors by XOR'ing the modified track parity data with the track parity information read from the selected track.

15. The method of claim 12 wherein the second-level error correction generates the track band parity information in sectors by using a Vandermonde matrix discrete Fourier transform (DFT).

16. The method of claim 12 wherein the second-level error correction generates the track band parity information in sectors by using a Vandermonde matrix discrete Fourier transform (DFT) in tandem with a Cauchy-Matrix parity sector encoder.

17. The method of claim 12 wherein the second-level error correction generates the track band parity information using iterative calculation with programmable-multipliers and storage accumulator memory.

18. The method of claim 12 wherein the second-level error correction generates the track band parity information in sectors by using a Vandermonde matrix discrete Fourier transform (DFT) in tandem with a Cauchy-Matrix parity sector encoder and wherein the matrices are structured and an encoder/syndrome-generator and decoder use programmable-multipliers and SRAM-storage accumulators for iterative calculations.

* * * * *